United States Patent [19]

Bouny

[11] Patent Number: 5,061,910
[45] Date of Patent: Oct. 29, 1991

[54] BALUN TRANSFORMERS

[75] Inventor: Jean J. Bouny, Bordeaux, France

[73] Assignee: Motorola, Inc., Schaumburg, Ill.

[21] Appl. No.: 572,737

[22] Filed: Aug. 27, 1990

[30] Foreign Application Priority Data

Sep. 18, 1989 [FR] France ................... 89 12196

[51] Int. Cl.⁵ ............................................. H01P 5/10
[52] U.S. Cl. ...................................... 333/26; 336/200;
330/275
[58] Field of Search .................... 333/25, 26; 336/200

[56] References Cited

U.S. PATENT DOCUMENTS

| 3,656,071 | 4/1972 | Woodward | 333/26 |
| 3,991,390 | 11/1976 | Conroy | 333/26 |
| 4,857,869 | 8/1989 | Terakawa et al. | 333/26 |
| 4,980,654 | 12/1990 | Moulton | 333/26 X |

FOREIGN PATENT DOCUMENTS 2084809  4/1982  United Kingdom .

Primary Examiner—Paul Gensler
Attorney, Agent, or Firm—Robert M. Handy; Eugene A. Parsons

[57] ABSTRACT

A balun is formed by printed tracks (20,22) on a printed circuit board. A first conductor to one side of the board extends between ground (13) and single ended signal port 11. A second conductor to the other side of the board extends between ground 21 and a balanced signal port (12) in electrical symmetry. The arrangement provides a construction wherein the balanced side of the balun is entirely on one side of the board, resulting in symmetrical parasitic effects in the balanced limbs. Also cross board connections are not required. The balun allows a printed circuit form to be used where parasitic effects are likely, such as high frequency power amplifiers with their associated large heat sink, replacing other forms, such as coaxial cable types.

8 Claims, 2 Drawing Sheets

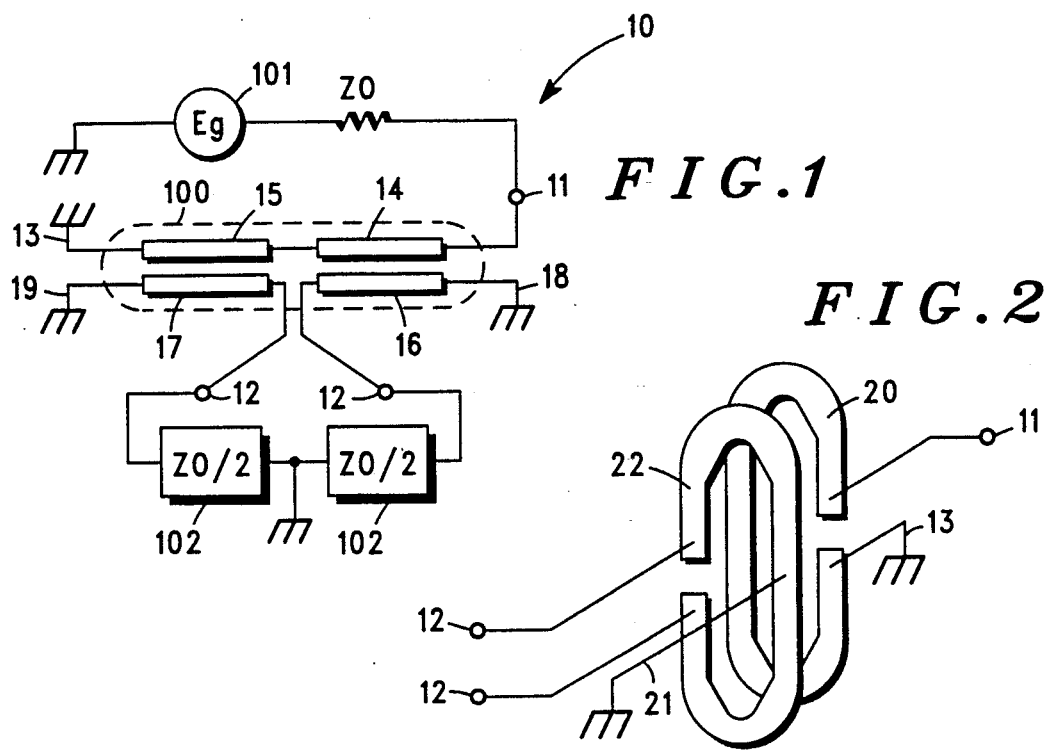
*FIG.1*
*FIG.2*
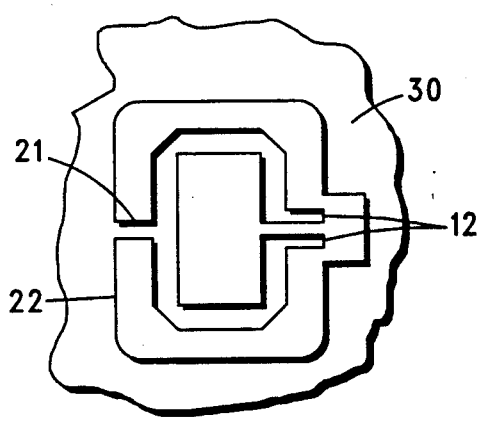
*FIG.3A*
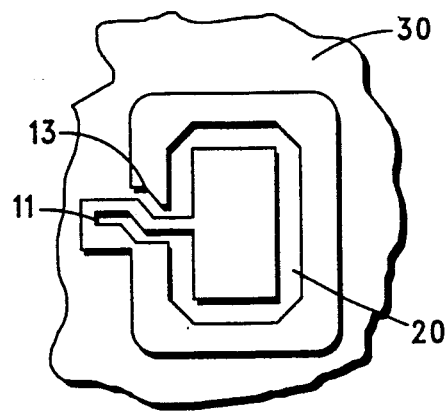
*FIG.3B*
*FIG.3C*

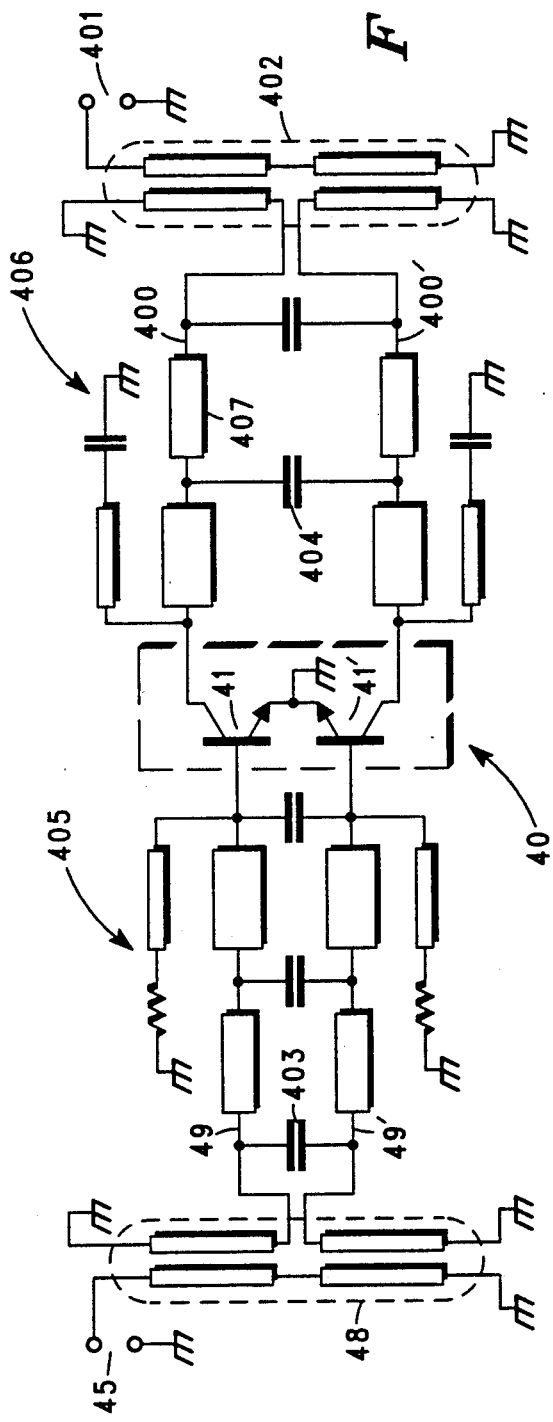

BALUN TRANSFORMERS

FIELD OF THE INVENTION

The present invention relates to baluns, that is transformers capable of matching a single-ended output to a balanced input and vice versa.

BACKGROUND OF THE INVENTION

As an example of the application of a balun consider a high power transistor amplifier. Where output power requirements exceed that which can be delivered by a single transistor, a plurality of transistors may be coupled to share the power demand. In the base station of a cellular radio network, for example, operating in the high frequency region of 900 MHz, an output power requirement at the antenna feed of 1 kwatt would be typical, delivered by ten 100 watt amplifier modules. Presently the upper limit power capability of radiofrequency (r.f.) power transistors is in the region of 60 watt, hence to provide such a 100 watt module coupled transistors must be used.

A convenient and useful method of coupling two transistors is the technique known in the art as "push-pull". Here the drive is shared between a transistor driving current through the load in one direction and a second transistor driving current through the load in the opposite direction. The arrangement is advantageous in terms of impedance matching, presenting a higher output impedance than the very low impedance of a single transistor or the yet lower impedance of parallel transistors, the higher output impedance being closer to the typical target impedance of 50, but unfortunately is inherently a balanced system, that is it produces an output signal which is symmetrical with respect to the common ground potential of the coupled transistors, whereas typically a single-ended (that is ground referenced) output signal is required. A solution to this problem is to provide a transformer between the output of the push-pull pair and the load. By virtue of its isolating properties, a transformer is able to couple the balanced output to the single-ended load. Such a transformer is that referred to in the art as a balun.

In the case of push-pull arrangement, a similar problem exists in providing the complementary balanced drive signals required by the push-pull pair from a single-ended input signal to the amplifier. A balun may be used to convert such an unbalanced input to the balanced drive signals.

Many forms of balun, including transmission line forms, are known in the art. Examples have been described by C. L. Ruthroff in his paper "Some Broad-Band Transformers" (Proceedings of the Institute of Radio Engineers, 1959), pages 1337-1342.

In high frequency r.f. amplifier applications a coaxial cable transmission line balun is typically used, for example a quarter wavelength length of cable having its outer conductor grounded at the single-ended side. An applied single-ended input will then generate a balanced output between the cable conductors at the remote end of the cable; equally a balanced signal applied to the non-grounded side will produce a single-ended output. The incorporation of such baluns in r.f. push-pull amplifier circuits will be known to those skilled in the art.

Although providing good performance, there are a number of drawbacks associated with coaxial cable baluns. The baluns are made by cutting coaxial cable to length and at high frequency even small inaccuracies in length affect performance, also the nature of the cable component is not susceptible to mechanized placement and soldering. Hence the manufacturing tolerances associated with manual assembly create performance variations between one amplifier and another. In an attempt to overcome this problem baluns of printed form, which give good repeatability, have been tried. Printed circuit forms of baluns are known (see for example U.S. Pat. No. 4,193,048 issued to Nyhus). Unfortunately, a conventional construction printed flat on a circuit board cannot be used in high power applications due to the proximity of the large metal heatsinks associated with the amplifying transistors. Inevitably, one side of the circuit board is closer to the metal than the other causing an unacceptable imbalance in parasitic capacitances applied to the balun. To date, only simple printed forms have been used on separate boards mounted normal to the amplifier circuit board to give parasitic symmetry. Such boards are mechanically vulnerable and although repeatable in themselves, cannot be automatically assembled.

The present invention, by contrast, provides a balun construction, useful in high power applications which may be printed flat.

SUMMARY OF THE INVENTION

According to the present invention there is provided a balun providing a single-ended signal port and a balanced signal port, the balun including:
- a plurality of serially connected first conductor elements extending between said single-ended signal port and ground,
- and a plurality of second conductor elements transformingly coupled to the first conductor elements and electrically isolated therefrom,
- said second conductor elements extending in electrical symmetry from ground to said balanced port, and said first and second conductor elements being separated by an electrical isolation layer.

Preferably the conductor elements take the form of a contiguous merged conductor, which may be of similar form, such as, for example of closed loop form. Advantageously, the second conductor elements extend from a common ground. The conductors may be realized in printed circuit form.

In a preferred form of the present invention suitable for wide band applications, a leakage compensation capacitor is connected at the balanced output port and conductor elements may be surrounded by a grounded conductor.

A balun in accordance with the present invention may be used in an amplifier, such as a high power r.f. amplifier including a push-pull stage.

BRIEF DESCRIPTION OF THE DRAWINGS

In order that features and advantages of the present invention may be further appreciated embodiments will now be described, by way of example only, with reference to the accompanying diagrammatic drawings, of which:

FIG. 1 represents a balun in accordance with the present invention;

FIG. 2 represents a form of the balun of FIG. 1;

FIG. 3(a) represents a view of a printed circuit form of balun in accordance with the present invention from one side of a printed circuit board;

FIG. 3(b) represents opposite side;

FIG. 3(c) represents the decoupled version of FIG. 3(a);

FIG. 4 represents a push-pull r.f. power amplifier including baluns in accordance with the present invention; and FIG. 5 is a sectional view of the amplifier of FIG. 4 constructed on a printed circuit board.

DETAILED DESCRIPTION OF THE INVENTION

A balun 10 (FIG. 1) provides a single-ended signal port 11 and a balanced signal port 12. Conductor elements 14 and 15 form a first element group extending from the single-ended port 11 to a ground 13. Conductor elements 16 and 17 extend from the balanced port 12 to grounds 18, 19 respectively and are electrically symmetrical. Conductor elements 14 and 15 constitute a first conductor pair which is electrically isolated from a second conductor pair constituted by conductor elements 16 and 17. In use, a signal applied to the single-ended port 11 produces a balanced signal output at balanced signal port 12 by virtue of transformer coupling (indicated diagrammatically at 100) between the first conductor pair (14,15) acting as a primary and the second conductor pair (16,17) acting as a secondary. For example, a signal due to a single-ended generator 101 may drive a balanced load 102 of value $Z_o$. Alternatively, a balanced signal applied to the balanced port 12 yields a single-ended output signal at port 11. In this arrangement conductors 16,17 constitute the primary and conductors 14,15 the secondary.

In a preferred form of the present invention, conductors 14 and 15 are formed as a single merged conductor 20 (FIG. 2) and grounds 18 and 19 formed at a common point 21 which is a point where there is zero RF voltage, and which can be decoupled by a capacitor 25 to connect a power supply feed 23 (FIG. 3(c)), so that conductors 16,17 are also formed as a single conductor 22. Otherwise similar parts bear the same reference numerals as in FIG. 1.

It will be appreciated that this form of the present invention lends itself to fabrication on a printed circuit board construction, conductors 20 and 22 being printed directly upon the printed circuit board surface. The resultant arrangement may be seen more clearly in FIG. 3a–3c wherein similar parts bear common reference numerals with FIG. 1 and 2. In the arrangement of FIGS. 3a–3c conductor 20 on one side of the printed circuit, conductor 22 on the other side and port connections 11 and 12 are surrounded by a ground plane 30. Proximity of the ground plane establishes this as the principle source of parasitic capacitances coupled to the transformer, hence reducing the effect of other stray capacitances which may be present. The ground plane may be omitted on the upper surface (FIG. 3A) of the board, if desired in which case common point 21 is connected to any convenient ground, such as the ground plane on the lower surface, by means of plated through holes or the like.

A number of advantages of this printed form of the present invention will now be apparent to those skilled in the art. The balun is printed flat on the printed circuit board, which may be the same printed circuit board as carries an amplifier, for example, and so is repeatable with printed circuit board precision. No assembly is required and there is no component or assembly tolerance to affect circuit performance.

The embodiments of the balun described thus far are suitable for use in a high frequency r.f. power amplifier circuit utilizing transistors in push-pull. An amplifier 40 (FIG. 4, in which baluns are shown in schematic representation) comprises two transistors 41,41' arranged in a push-pull configuration. The actual circuit suitable in a given application being within the competence of those skilled in the art. An input signal for amplification may be applied at single-ended input 45. A balun 48 in accordance with the present invention provides complementary balanced signals on lines 49,49' to drive the push-pull pair 41,41' from the printed matching network 405, which in turn provides a balanced amplified output on lines 400,400' via a second matching network 406 including microstrip lines, such as line 407 to be converted to a single-ended final output at 401 by balun 402. The baluns 48 and 402 have capacitors 403,404 connected across their respective balanced ports to compensate for leakages in wide-band applications.

Referring also to FIG. 5, a constructed form 50 of the push-pull amplifier of FIG. 4 is mounted on a printed circuit board 51 which may be made of Teflon(-Trademark)/glass material as suitable for r.f. applications. Baluns 48 and 402 have conductors 20',22' and 20",22" respectively present on respective sides of the board 51. The conductors are surrounded by ground plane 30'. Power transistors (41,41') in a single package 55, has its metal mounting plate 52 fixed to a metal heat-sink 53 by bolt 54 so that it is connected to ground. The base and collector transistor supplies may be connected via decoupled baluns of the type shown in FIG. 3(c). Heatsink 53 is required to be massive in view of the high heat dissipation of the amplifier, which typically would be operating in class AB, or even class A both of which are relatively inefficient, hence heatsink 53 extends the length of board 51 to provide a compact structure as is required to keep a complete high power r.f. amplifier (consisting of many such amplifiers) of reasonable size. Cut outs 57,58 are provided in heatsink 53 to accommodate the underside conductors of baluns 48,402 respectively.

It will be appreciated that the balance side conductors (22' for balun 48, 22" for balun 402) are each affected uniformly by any parasitism there may be due to the proximity of heatsink 53, that is both sides of the balanced output (balun 48) or balanced input (balun 402) are equally affected.

This is the important result which allows the baluns to be printed flat as part of the amplifier printed circuit board. This is a departure from prior art printed balun arrangements where the balanced side is formed part above and part below the printed circuit board leading to unacceptably asymmetric parasitic effects.

The foregoing embodiments of the present invention have been described with reference to printed circuit board construction, being a suitable way of providing conductor elements electrically isolated by a dielectric carrier. It will be appreciated, nonetheless, that the present invention is applicable to all constructions providing electrically isolated conductors.

I claim:

1. A balun providing a single-ended signal port and a balanced signal port, the balun including:

a plurality of serially connected first conductor elements extending between said single-ended signal port and ground, and a plurality of second conductor elements transformingly coupled to the first conductor elements and electrically isolated therefrom, said second conductor elements extending in electrical symmetry from ground to said balanced port, and said first and second conductor elements being separated by an electrical isolation layer.

2. A balun as claimed in claim 1 and wherein said first and second conductor elements respectively take the form of a contiguous merged conductor.

3. A balun as claimed in claim 2 and wherein the merged conductors are of similar form.

4. A balun as claimed in claim 1 and wherein the second conductor elements extend from a common ground.

5. A balun as claimed in claim 1 wherein said conductors are in printed circuit form.

6. A balun as claimed in claim 1 further including a leakage compensation capacitor connected at said balanced output port.

7. A balun as claimed in claim 1 and wherein said conductor elements are surrounded by a grounded conductor.

8. A balun printed on a printed circuit board having an upper side and a lower side, said balun providing a single-ended signal port and a balanced signal port, the balun including:

a plurality of serially connected first conductor elements extending between said single-ended signal port and ground, and a plurality of second conductor elements transformingly coupled to the first conductor elements and electrically isolated therefrom, said second conductor elements extending in electrical symmetry from ground to said balanced port, and said first conductor elements being printed on said lower side of said printed circuit board and said second conductor elements being printed on said upper side of the printed circuit board.

* * * * *